United States Patent

Eastty et al.

[11] Patent Number: 6,061,007
[45] Date of Patent: May 9, 2000

[54] 1-BIT SIGNAL PROCESSING SYSTEM

[75] Inventors: Peter Charles Eastty, Oxford; Christopher Sleight, Chipping Norton; Peter Damien Thorpe, Oxford, all of United Kingdom

[73] Assignee: Sony United Kingdom Limited, Weybridge, United Kingdom

[21] Appl. No.: 08/979,251

[22] Filed: Nov. 26, 1997

[30] Foreign Application Priority Data

Nov. 27, 1996 [GB] United Kingdom ............... 9624703

[51] Int. Cl.[7] .................................................. H03M 3/00
[52] U.S. Cl. ............................... 341/77; 341/67; 341/143
[58] Field of Search ............................. 341/76, 77, 67, 341/65, 143

[56] References Cited

U.S. PATENT DOCUMENTS

| 3,777,066 | 12/1973 | Nicholas | 375/365 |
|---|---|---|---|
| 4,516,246 | 5/1985 | Kenemuth . | |
| 4,546,342 | 10/1985 | Weaver et al. | 341/76 |
| 4,630,007 | 12/1986 | Lagadec . | |
| 4,910,751 | 3/1990 | Einarsson | 341/67 |
| 5,260,693 | 11/1993 | Horsley | 341/67 |

FOREIGN PATENT DOCUMENTS

| 1023029 | 3/1966 | United Kingdom . |
|---|---|---|
| 1336317 | 11/1973 | United Kingdom . |
| WO 93/11611 A1 | 6/1993 | WIPO . |

*Primary Examiner*—Howard L. Williams
*Attorney, Agent, or Firm*—Frommer Lawrence & Haug, LLP.; William S. Frommer

[57] ABSTRACT

A 1-bit signal (44) is compressed (40, 41) by dividing it into a series of n-bit words and encoding the words according to the probability of their occurrence.

11 Claims, 4 Drawing Sheets

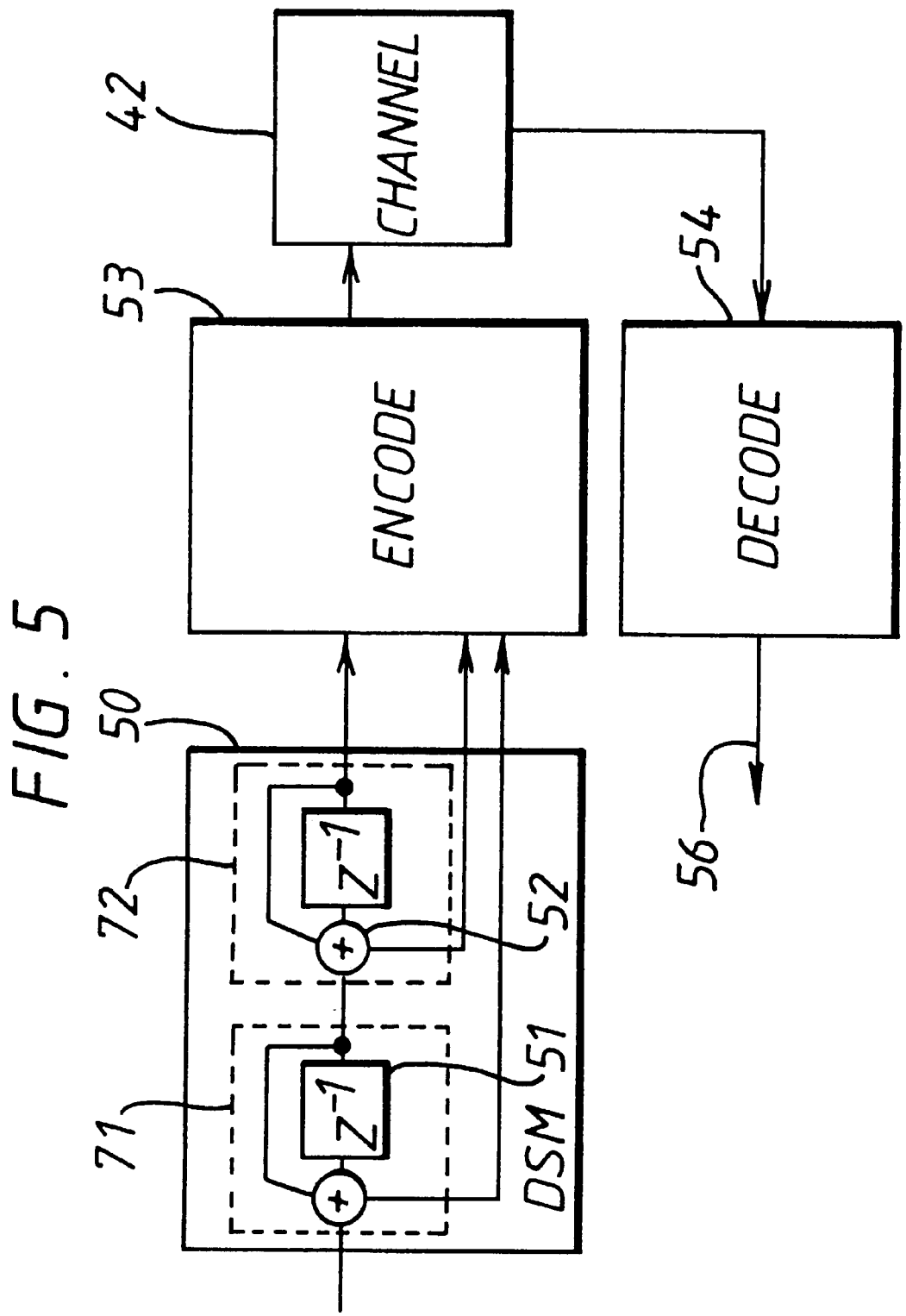

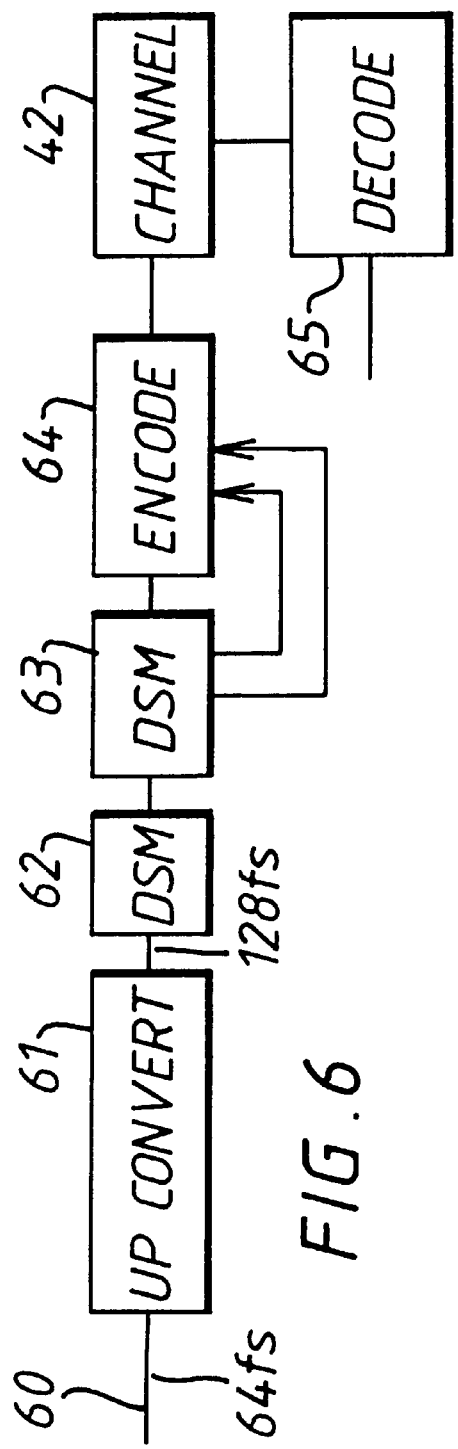
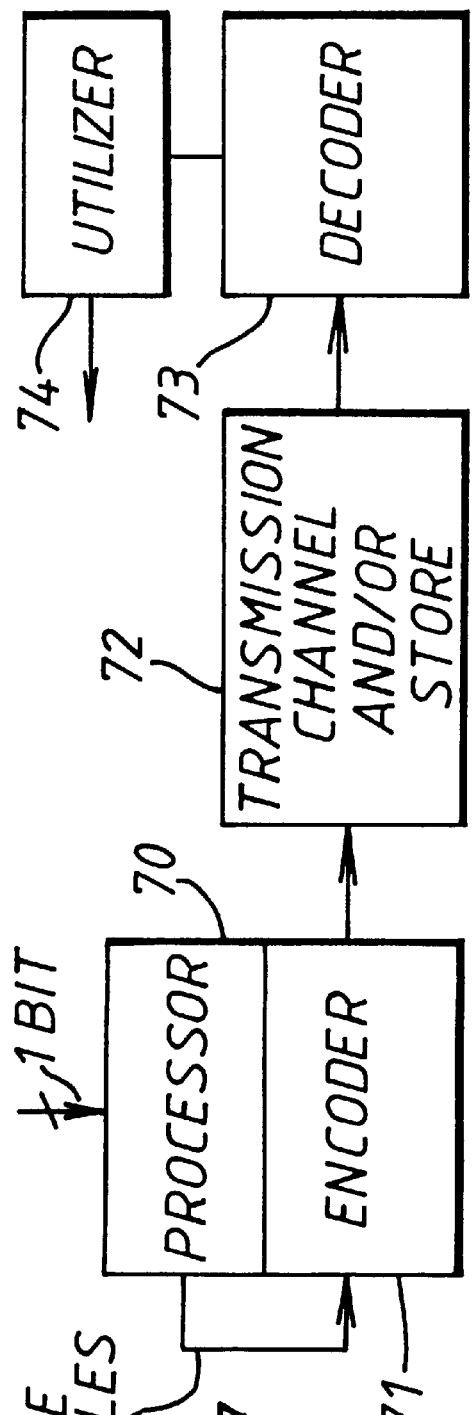

1-BIT SIGNAL PROCESSING SYSTEM

BACKGROUND OF THE INVENTION

1. Field of the Invention

One aspect of the present invention relates to a signal processor for processing a 1-bit signal. Another aspect of the invention relates to a signal processor for a 1-bit signal, the processor comprising an nth order Delta-Sigma Modulator where $n \geq 1$. Preferred embodiments of the invention relate to processing audio signals and the invention will be described herein in relation to audio signal processors but the invention is not limited to audio signal processors.

2. Description of the Prior Art

Background to the present invention will now be described by way of example with reference to FIGS. 1, 2 and 3 of the accompanying drawings of which FIG. 1 is a block diagram of a known Delta-Sigma Modulator, FIG. 2 is a block diagram of a previously proposed Delta-Sigma Modulator configured as an nth order filter section and FIG. 3 shows a noise shaping characteristic.

It is known to convert an analogue signal to a digital form by sampling the analogue signal at at least the Nyquist rate and encoding the amplitudes of the samples by an m bit number. Thus if m=8, the sample is said to quantized to an accuracy of 8 bits. In general m can be any number of bits equal to or greater than 1.

For the purpose of quantizing to only 1 bit, it is known to provide an analogue to digital converter (ADC) known either as a "Sigma-Delta ADC" or as a "Delta-Sigma ADC". Herein the term "Delta-Sigma" is used. Such an ADC is described in for example "A Simple Approach to Digital Signal Processing" by Craig Marven and Gillian Ewers ISBN 0-904.047-00-8 published 1993 by Texas Instruments.

Referring to FIG. 1 in an example of such an ADC, the difference (Delta) between an analogue input signal and the integral (Sigma) of the 1-bit output signal is fed to a 1-bit quantizer 3. The output signal comprises bits of logical value 0 and 1 but representing actual values of −1 and +1 respectively. The integrator 3 accumulates the 1-bit outputs so that value stored in it tends to follow the value of the analogue signal. The quantizer 3 increases (+1) or reduces (−1) the accumulated value by 1-bit as each bit is produced. The ADC requires a very high sampling rate to allow the production of an output bit stream the accumulated value of which follows the analogue signal.

The term "1-bit" signal as used in the following description and in the claims means a signal quantized to an accuracy of 1 digital bit such as is produced by a Delta-Sigma ADC.

A Delta-Sigma Modulator (DSM) configured as $\underline{n}$th order filter section for directly processing a 1-bit signal was proposed by N. M. Casey and James A. S. Angus in a paper presented at the 95th AES Convention Oct. 7–10, 1993 New York, USA entitled "One Bit Digital Processing of Audio Signals" (Signal Processing: Audio Research Group, The Electronics Department, The University of York, Heslington, York YO1 5DD England). FIG. 2 shows a 3rd order (n=3) version of such a DSM filter section.

Referring to FIG. 2, the DSM has an input 4 for a 1-bit signal and an output 5 at which a processed a 1-bit signal is produced. The bits of the 1-bit signal are clocked through the DSM by known clocking arrangements which are not shown. The output 1-bit signal is produced by a 1-bit quantizer Q which is for example a comparator having a threshold level of zero. The DSM has three stages each comprising a first 1-bit multiplier $a_1$, $a_2$, $a_3$ connected to the input 4, a second 1-bit multiplier $c_1$, $c_2$, $c_3$ connected to the output 5, an adder $6_1$, $6_2$, $6_3$ and an integrator $7_1$, $7_2$, $7_3$.

The 1-bit multipliers multiply the received 1-bit signal by $\underline{p}$ bit coefficients $A_1$, $A_2$, $A_3$, $C_1$ $C_2$, $C_3$ producing $\underline{p}$ bit multiplicands which are added by the adders $6_1$, $6_2$, $6_3$ and the sums passed to the integrators 7. In the intermediate stages the adders $6_2$, $6_3$ also sum the output of the integrator of the preceding stage. A final stage comprises another 1-bit multiplier $A_4$ connected to the input which multiplies the input signal by a $\underline{p}$ bit coefficient $A_4$ and an adder $6_4$ which adds the multiplicand to the output of the integrator $7_3$ of the preceding stage. The sum is passed to the quantizer 2.

Within the DSM, two's complement arithmetic is used to represent the positive and negative $\underline{p}$ bit numbers. The input to the quantizer Q may be positive, quantized at the output as +1 (logical 1) or negative quantized at the output as −1 (logical 0).

As observed by Casey and Angus "a one bit processor . . . will produce a one bit output that contains an audio signal that is obscured by noise to an unacceptable level and it is imperative the quantization noise is suitably shaped". The noise which obscures the audio signal is the quantization noise produced by the quantizer Q.

The quantizer Q may be modelled as an adder which has a first input receiving an audio signal and a second input receiving a random bit stream (the quantization noise) substantially uncorrelated with the audio signal. Modelled on that basis, the audio signal received at the input 4 is fed forward by multipliers $a_1$, $a_2$, $a_3$, $a_4$ to the output 5 and fed back by multipliers $c_1$, $c_2$, $c_3$ from the output 5. Thus coefficients A1 to A4 define zeros of the Z-transform transfer function of the audio signal and coefficients C1–C3 define poles of the transfer function of the audio signal.

The noise signal, however is fed-back from the quantizer by the multipliers $C_1$–$C_3$ so that coefficients C1–C3 define poles of the transfer function of the noise signal.

The coefficients A1 to A4 and C1 to C3 are chosen to provide circuit stability amongst other desired properties.

The coefficients C1–C3 are chosen to provide noise shaping so as to minimise quantization noise in the audio band, as shown for example in FIG. 3 by the full line 31.

The coefficients A1–A4 and C1–C3 are also chosen for a desired audio signal processing characteristic.

The coefficients A1–A4 and C1–C3 may be chosen by:
a) finding the Z-transform H(z) of the desired filter characteristic—e.g noise shaping function; and
b) transforming H(z) to coefficients.

This may be done by the methods described in "Theory and Practical Implementation of a Fifth Order Sigma-Delta A/D Converter, Journal of Audio Engineering Society, Volume 39, no. 7/8, 1991 July/August by R. W. Adams et al." and in the above mentioned paper by Angus and Casey using the knowledge of the person skilled in the art. One way of producing coefficients is outlined in Annex A.

SUMMARY OF THE INVENTION

According to one aspect of the invention, there is provided a signal processor for processing a 1-bit signal stream, comprising means for dividing a 1-bit stream into a succession of n bit words (where n>>1), and means for coding the n bit words as coded words of less than n bits.

The bit stream of a 1-bit signal especially one produced by a DSM approximates a random sequence and therefore appears to be unresponsive to compression techniques which exploit redundancy and/or correlation between parts of a signal because it appears that no such redundancy or correlation exists. However, in accordance with the invention, it has been appreciated that some sequences of bits are more unlikely than others and some may in fact seldom if ever occur especially in audio signals. For example, a prolonged sequence of +1's or of −1's is highly unlikely because it signifies maximum positive or negative amplitude of the signal. Thus the bit stream may be compressed by dividing it into words of n bits where n>>1 and encoding the words according to their probability of occurrence.

The n-bit words may comprise mutually exclusive sets of n-bits in one embodiment. In another embodiment, an n-bit window is used through which the 1-bit signal stream continuously passes. Each of the successive different sets of n-bits in the window is encoded.

Other encoding schemes may be used. One encoding scheme uses predictive encoding. A window (n−1) bits in length may be used. The bit stream passes through the window continuously. The n−1 bits in the window are used to predict the nth bit. In another encoding scheme, a window Q bits wide is used for encoding a subset n-bits long of the Q bits where n is less than Q, using those of the Q bits preceding and succeeding the n-bits.

In accordance with another aspect of the invention, there is provided a signal processor for processing a 1-bit signal comprising: an nth order Delta-Sigma Modulator (DSM) where n>1, the DSM having n integrator stages; and an encoder for reducing the bit rate of the 1-bit signal, the encoder being responsive to the state variables of the n integrator stages.

The encoding of the 1-bit signal is improved by knowledge of the processor producing the signal because the signal sequence is dependent on the process to which the signal is subject. By using the state variables of the DSM as represented by the values stored in the integrators of the DSM the encoding efficiency is improved.

In an embodiment of the another aspect, the sampling rate of the 1-bit signal is increased. This spreads the quantisation noise power over a broader band width reducing noise in the signal band. In the embodiment, the encoder encodes the higher rate 1-bit signal to reduce the data content of the 1-bit signal. This reduces storage required to store the signal e.g. on a tape or disc or the bandwidth needed to transmit the signal in a transmission channel.

According to a further aspect of the invention, there is provided a 1-bit signal processing system comprising: a signal processing means for processing a 1-bit signal; an encoder responsive to the state variables of the signal processing means to compress the processed signal; and a transmission channel and/or storage means coupled to receive the processed and encoded signal from the encoder.

The present invention is based on the new recognition that a 1-bit signal is compressible despite its random nature. Embodiments of the invention relate to the data sources which are usable to control the compression.

BRIEF DESCRIPTION OF THE DRAWINGS

The above and other objects, features and advantages of the invention will be apparent from the following detailed description of illustrative embodiments which is to be read in connection with the accompanying drawings, in which:

FIG. 5 is a schematic block diagram of an alternative encoding and decoding apparatus according to an embodiment of the invention;

FIG. 6 is a schematic block diagram of yet another encoding and decoding apparatus according to the invention; and FIG. 7 is a block diagram of a signal processing system in accordance with an aspect of the invention.

DESCRIPTION OF THE PREFERRED EMBODIMENTS

Figure 4A:
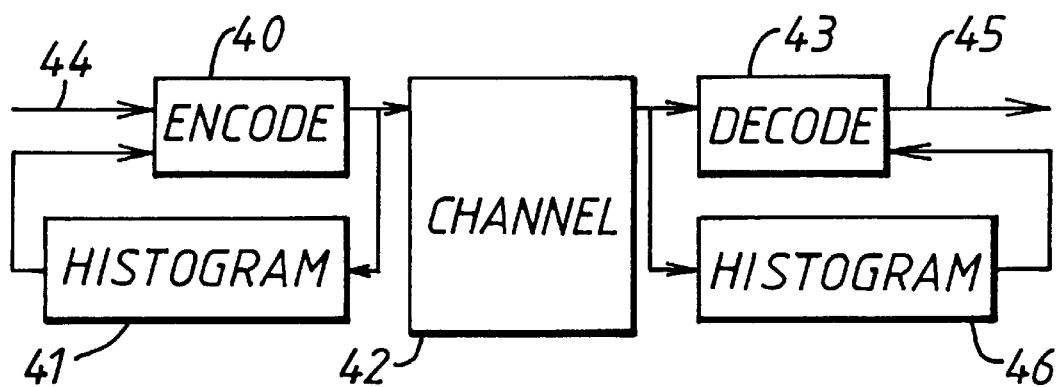
FIG. 4A is a schematic block diagram of an encoding decoding apparatus according to an embodiment of the invention.

Referring to FIG. 4A, a 1-bit signal at an input 44 is fed to an encoder 40. The encoder compresses the bit stream by dividing it into n-bit words and encoding the words according to a measure of the probability of occurrence. The measure of probability is provided by a histogram circuit 41 which builds a histogram of the frequency of occurrence of the words. The encoded bit stream is provided to a channel 42 which may be a tape recorder or disc recorder or a transmission channel. The encoded bit stream reduces the amount of storage space or bandwidth required. A decoder 43 and histogram circuit 46 decode the encoded words from the channel in a manner complementary to the encoding process. The histogram builds a table which maps the received and uncompressed n-bit words onto corresponding compressed words of less than n bits.

Figure 4B:
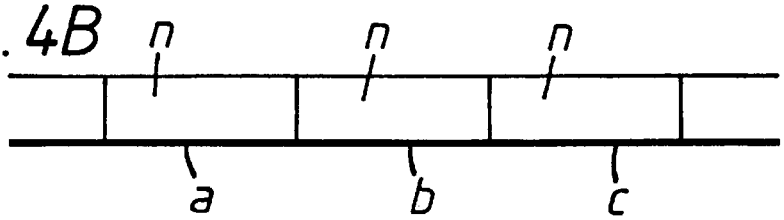
FIGS. 4B to 4E are signal diagrams illustrating sets of bits and windows used in embodiments of the invention.

Referring to FIG. 4B, the encoding may be performed on mutually exclusive sets of n bits. As shown in FIG. 4B a 1-bit signal bit stream is divided into sets a, b, c of bits each set comprising n bits. The encoder 40 and histogram circuit 41 act on e.g. the first set a, then on the second set b and then on the third set c and so on.

Figure 4C:
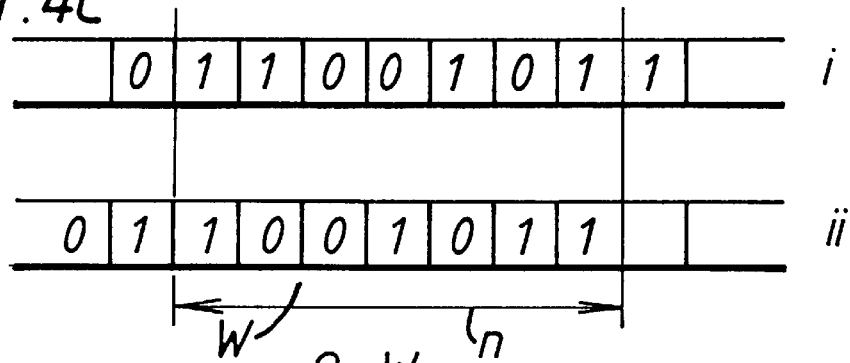

Referring to FIG. 4C, the encoding may be performed on each successive sets of n bits within a window W n-bits wide. The bit stream flows continuously through the window. Thus as shown in FIGS. 4Ci and 4Cii a set of n bits is encoded and then the bit stream moves on by 1 bit and the next set of n bits including n−1 bits of the previous set is encoded.

Figure 4D:
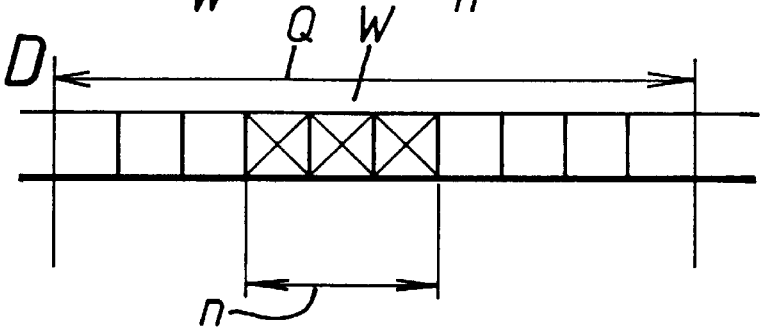

Referring to FIG. 4D, the window W may be Q bits wide where Q is greater than n, and the set of n bits in the middle of the window is encoded on the basis of the bits preceding and succeeding the set of n bits.

Figure 4E:
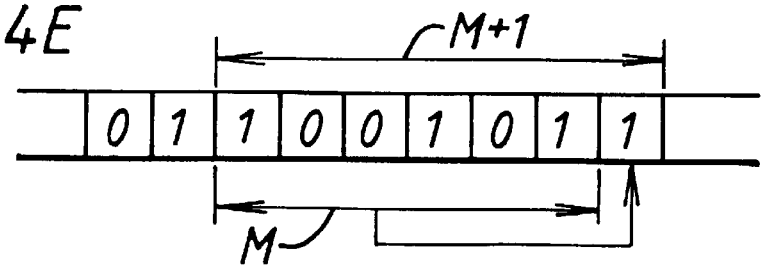

As shown in FIG. 4E, the encoding may be predictive and performed on the basis of a set of M bits which are used to predict the next, M+1th bit.

Figure 1:
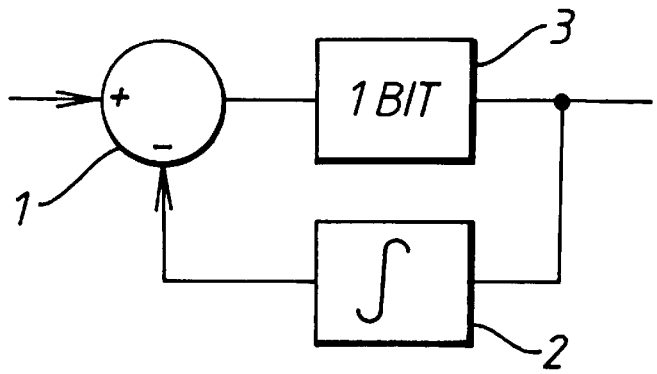
Figure 2:
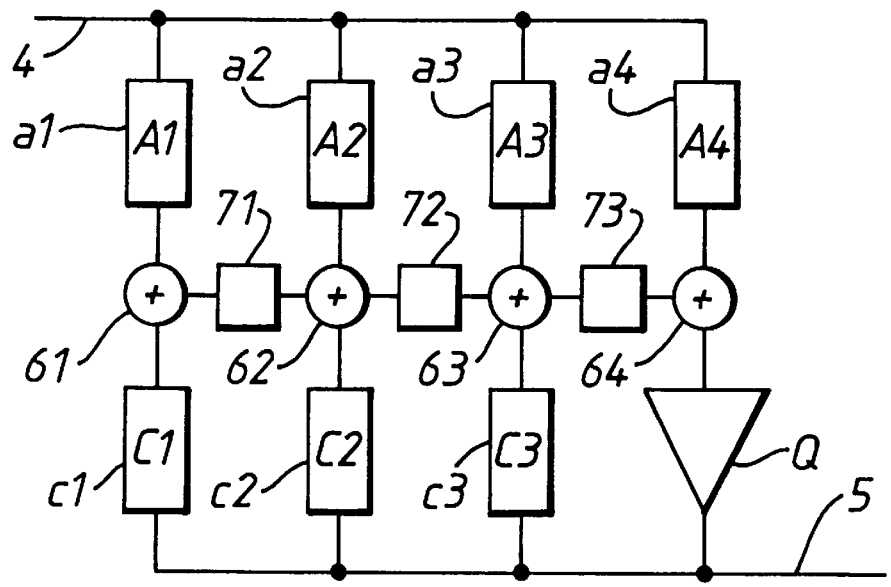
Figure 3:
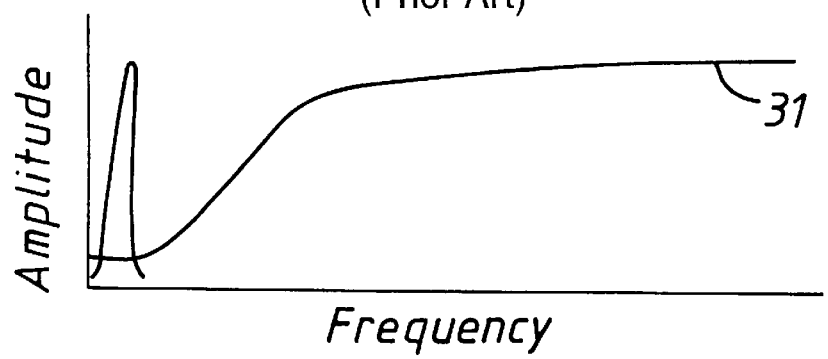

Referring to FIG. 5, the 1-bit signal may be processed by a Delta-Sigma Modulator (DSM) as described hereinbefore, or in co-filed applications 9624674.9 (I-96-16), 9624671.5 (I-96-24), 9624673.1 (I-96-25), Attorney References P/1508.GB, P1509.GB and P/1510.GB, as represented by block 50. The DSM has at least one integrator stage corresponding to block 71, 72 in FIG. 2 and comprising an adder 52 and a unit time delay 51 which feeds delayed signal samples back to the adder 52. The adder 52 thus accumulates the integral of the signal. The values in the adder 52 of each integrator stage are state variables of the DSM. In this embodiment the state variables are fed to an encoder 53 to aid the encoding process. The encoder compresses the bit stream in accordance with the state variables. The encoded bitstream is transmitted by a channel 42 to a decoder 54 which reproduces the original 1-bit signal, the informatin for the decoding being present on the encoded bit stream.

Referring to FIG. 6, the 1-bit signal has, at an input 60, a sampling rate of 64 fs where fs=44.1 or 48 Khz the standard sampling rate for digital audio.

An up converter 61 increases the sampling rate to e.g. 128 fs by repeating sample values or by inserting zeroes in the bit stream. Increasing the sampling rate spreads the noise power over a larger bandwidth.

In the example of FIG. 6, the 1-bit signal is processed by one or more DSMs 62, 63 in series and encoded by an encoder 64 responsive to the state variables of DSM 63 to compress the data in the signal as discussed with reference to FIG. 5.

The encoded signal is provided to the channel 42 as described with reference to FIG. 5.

The signal produced by the channel is decoded by a decoder 65 complementary to the encoder 64.

FIG. 7 illustrates an audio signal processing system incorporating encoding and decoding according to embodiments of the invention. In FIG. 7 a 1-bit audio signal is supplied to a signal processor 70 which incorporates for example a DSM such as is shown in FIG. 6. An encoder 71 for comprising the bit stream is associated with the processor 70, the compression being controlled by the state variables of the processor 70. The compressed data stream is then supplied to a transmission channel and/or storage device 72. The compressed data stream is recovered from channel/device 72, decoded in a decoder 73 to be further processed by a processor 74.

The efficiency of encoding is enhanced by associating the encoder 71 with the processor 70.

In hitherto conventional practice as applied to n bit signals where n>>1, the encoding as at 71 is unassociated with the processing as at 70, but instead encoding (and decoding) is performed at the transmission channel and/or storage device 72, without reference to the processing at the processor 70.

The encoders and decoders 40, 41; 43, 46; 53, 54, 64, 65 have not been described in detail. They are within the skill of those expert in encoding and decoding for data reduction. Examples of encoders and decoders are disclosed in: GB-A-1 023 029 (IBM) which describes a predictive encoder capable of predicting for each of successive M-bit sequences the most likely N-bit sequence following the M bit sequence; and U.S. Pat. No. 4,516,246 (Prentice Corporation) which describes a character base input data stream is encoded in compressed form by using a histogram of a sample of the data stream to determine the frequency of appearance of characters in the stream. A code for a character M+1 is generated in an encoder to be a length which is an inverse function of the frequency of appearance of character M+1 in the preceding M characters in the sample. Decoding can be achieved by forming a comparable sample window in a decoder to which is applied an estimated index of the incoming character being decoded.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A signal processor for processing a 1-bit signal comprising: an nth order Delta-Sigma Modulator (DSM) where n≧1, the DSM having n integrator stages; and an encoder for reducing the bit rate of the 1-bit signal, the encoder being responsive to the state variables of the integrator stages.

2. The processor according to claim 1 further comprising means for increasing the sampling rate of the 1-bit signal, the said DSM operating on the 1-bit signal having the increased sampling rate, the encoder reducing the data content of the signal.

3. The signal processor for processing a 1-bit signal processed by the processor of claim 1 comprising a decoder for decoding the encoded 1-bit signal, a Delta-Sigma Modulator having at least one integrator stage, the decoder being responsive to the data content of each integrator stage.

4. A 1-bit signal processing system comprising: a signal processing means for processing a 1-bit signal; an encoder responsive to the state variables of the signal processing means to compress the processed signal; and a transmission channel and/or storage means coupled to receive the processed and encoded signal from the encoder.

5. A system according to claim 4, further comprising a decoder for receiving the encoded 1-bit signal from the channel and/or storage means for decompressing the 1-bit signal; and means for utilising the decompressed 1-bit signal.

6. A signal processor for processing a 1-bit signal, comprising means for dividing a 1-bit stream into a succession of n bit words (where n>1), and means for coding the n bit words to produce a compressed bitstream of coded words, wherein the coding means codes an n bit word in dependence on at least one of the bits preceding and succeeding the n bit word.

7. The processor according to claim 6, wherein the dividing means comprises a window through which the bit stream continuously passes and each word comprises the bits within the window.

8. The processor according to claim 6, wherein the dividing means comprises a window through which the bit stream continuously passes, the window having a length of Q bits where Q is greater than n, and each n-bit word is a subset of the Q bits and is encoded in dependence upon the other Q-n bits in the window preceding and succeeding the said n-bit word.

9. The processor according to claim 6, wherein n−1 bits of each word are used to predict the nth bit of the word.

10. A signal processor for processing a 1-bit signal, comprising means for dividing a 1-bit stream into a succession of n bit words (where n>1), means for forming a histogram of the frequency of occurrence of the words, and means for encoding the words in accordance with the histogram to reduce the number of bits in the coded bit stream.

11. The processor according to claim 10, further comprising means for forming a histogram of the frequency of occurrence of the coded words and means for decoding the coded words in accordance with the histogram.

* * * * *